(12) United States Patent
Park

(10) Patent No.: US 9,508,882 B2
(45) Date of Patent: Nov. 29, 2016

(54) SOLAR CELL MODULE

(71) Applicant: LG INNOTEK CO., LTD., Seoul (KR)

(72) Inventor: Kyung Eun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/383,548

(22) PCT Filed: Mar. 6, 2013

(86) PCT No.: PCT/KR2013/001826
§ 371 (c)(1),
(2) Date: Sep. 6, 2014

(87) PCT Pub. No.: WO2013/133634
PCT Pub. Date: Sep. 12, 2013

(65) Prior Publication Data
US 2015/0020872 A1    Jan. 22, 2015

(30) Foreign Application Priority Data
Mar. 6, 2012 (KR) .......................... 10-2012-0022848

(51) Int. Cl.
*H01L 31/042* (2014.01)
*H01L 31/048* (2014.01)
*H01L 31/02* (2006.01)

(52) U.S. Cl.
CPC ....... *H01L 31/048* (2013.01); *H01L 31/02013* (2013.01); *H01L 31/0488* (2013.01); *Y02E 10/50* (2013.01)

(58) Field of Classification Search
CPC ............. H01L 31/048; H01L 31/0488; H01L 31/02013; H02S 30/10
USPC ................................................... 136/243–265
See application file for complete search history.

(56) References Cited

U.S. PATENT DOCUMENTS

| | | | |
|---|---|---|---|
| 2009/0126794 A1 | 5/2009 | Dimroth et al. | |
| 2010/0200047 A1 | 8/2010 | Ostermann | |
| 2012/0255610 A1* | 10/2012 | Bokria et al. | 136/259 |

FOREIGN PATENT DOCUMENTS

| | | |
|---|---|---|
| JP | 4076742 B2 | 4/2008 |
| KR | 10-2001-0108137 A | 12/2001 |
| KR | 10-1112980 B1 | 2/2012 |

OTHER PUBLICATIONS

Search Report for International Application No. PCT/KR2013/001826.
SIPO Office Action for Chinese Patent Application No. 201380023323.6 which corresponds to the above-identified U.S. application.

* cited by examiner

*Primary Examiner* — Allison Bourke
*Assistant Examiner* — Niki Bakhtiari
(74) *Attorney, Agent, or Firm* — LRK Patent Law Firm

(57) ABSTRACT

A solar cell module includes a solar cell panel including a plurality of solar cells and a bus bar connected to the solar cells, a protective substrate on the solar cell panel, and a spacer part between the solar cell panel and the protective substrate. The spacer part includes an air layer and a spacer surrounding the air layer.

10 Claims, 1 Drawing Sheet

SOLAR CELL MODULE

TECHNICAL FIELD

The embodiment relates to a solar cell module.

BACKGROUND ART

A solar cell module to convert light energy into electrical energy through photoelectric conversion effect has been extensively known as a device to obtain non-pollution energy contributing to the conservation of global environment.

As the photoelectric conversion effect of a solar cell is improved, a great number of solar cell systems having a solar cell module are installed even for home use.

In order to output power generated from the solar cell module including solar cells that generate power from the light of the sun to the outside, conductors acting as positive and negative electrodes are provided in the solar cell module, and terminals of the conductors, which serve as connectors connected to a cable of outputting current to the outside, are withdrawn out of a photovoltaic module.

A solar cell module having a typical structure includes an EVA sheet to bond a solar cell panel with a protective substrate which protects the solar cell panel. Since the EVA sheet may absorb moisture, the moisture may be infiltrated into the solar cell module. In addition, the weight of the solar cell module is increased due to the EVS sheet, so that the fabricating of the solar cell module is not easy.

Meanwhile, in order to connect a bus bar to a junction box, a hole must be provided in a lower substrate. However, since the hole is formed, the lower substrate may be broken due to variable causes including high temperature during the process of the solar cell module. In addition, a hole machining tool to form a hole in the lower substrate is required, so that the process time and the process cost may be increased.

In addition, recently, although the solar cell module has been demanded as the substitute for building glass for a window, the solar cell module cannot be easily applied to a building due to the problem related to thermal insulation.

DISCLOSURE

Technical Problem

The embodiment provides a solar cell module representing improved reliability.

Technical Solution

According to the embodiment, there is provided a solar cell module including a solar cell panel comprising a plurality of solar cells and a bus bar connected to the solar cells, a protective substrate on the solar cell panel, and a spacer part between the solar cell panel and the protective substrate. The spacer part includes an air layer and a spacer surrounding the air layer.

Advantageous Effects

As described above, the solar cell module according to the embodiment includes a spacer part including an air layer and a spacer. Since the spacer part includes the air layer to block the conduction of heat, the thermal insulation effect of the solar cell module can be improved. Accordingly, the solar cell module can be used as building glass for a window.

In addition, the EVA sheet to bond the protective substrate with the solar cell panel according to the related art can be omitted from the solar cell module by using the spacer part. Accordingly, the reliability of the solar cell module can be prevented from being degraded due to the moisture absorbed in the EVA sheet. In addition, since the EVA sheet is omitted, the material cost can be saved. In addition, the lamination process to form the EVA sheet can be omitted, so that the module process can be simplified. In addition, the weight of the solar cell module is reduced, so that the solar cell module can be easily fabricated.

Meanwhile, according to the solar cell module of the embodiment, the bus bar and the connection member can be connected to each other without forming a hole in the lower substrate. Therefore, the lower substrate can be prevented from being broken due to variable causes including high temperature during the process of the solar cell module. Accordingly, the process yield rate can be improved. In addition, a hole machining tool, which is employed to form a hole in the lower substrate according to the related art, is not employed, so that the process time and the process cost can be reduced.

MODE FOR INVENTION

In the following description of the embodiments, it will be understood that, when a layer (film), a region, a pattern or a structure is described to be "on" or "under" a substrate, another layer (film), region, pattern or structure, the layer (film), region, pattern or structure can be "directly" or "indirectly" on or under the substrate, the other layer (film), region, pattern or structure, or one or more intervening layers may also be present therebetween. Such a positional relation of each layer is described with reference to the drawings.

Hereinafter, the embodiment will be described in detail with reference to accompanying drawings.

Figure 1:
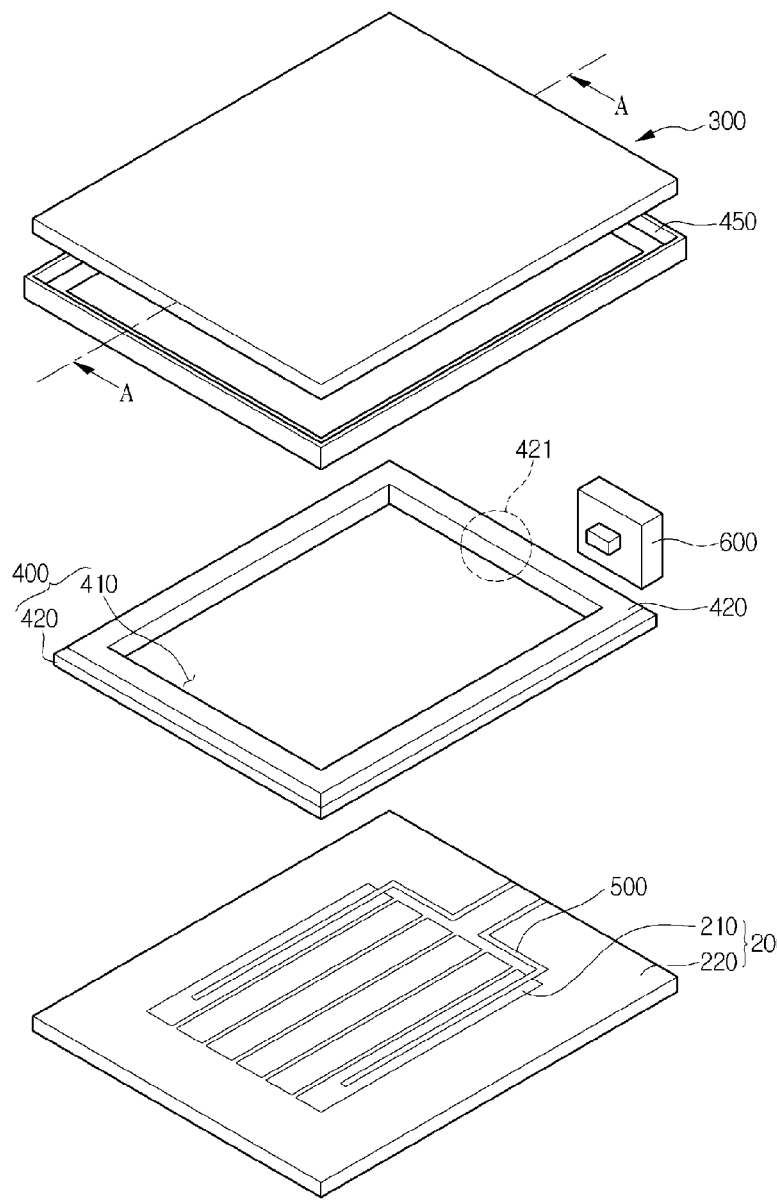
FIG. 1 is an exploded perspective view showing a solar cell module according to the embodiment.

Hereinafter, a solar cell module according to the embodiment will be described in detail with reference to FIGS. 1 and 2. FIG. 1 is an exploded perspective view showing a solar cell module according to the embodiment, and FIG. 2 is a sectional view taken along line A-A' of FIG. 1.

Figure 2:
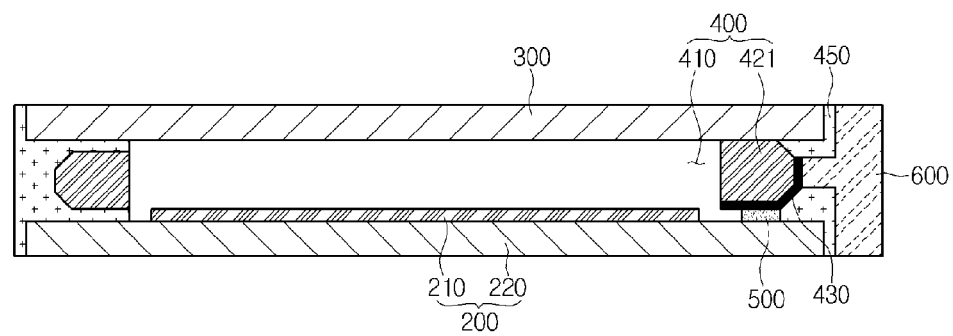
FIG. 2 is a sectional view taken along line A-A' of FIG. 1.

Referring to FIGS. 1 and 2, the solar cell module according to the embodiment includes a solar cell panel 200, a protective substrate 300, a spacer part 400, a bonding part 450, and a connection member 600.

The solar cell panel 200 is provided at the lower portion of the solar cell module. The solar cell panel 200 has the shape of a plate. The solar cell panel 200 includes a plurality of solar cells 210 and a lower substrate 220 to support the solar cells 210.

For example, the solar cells 210 may include a CIGS-based solar cell, a silicon-based solar cell, a dye-sensitized solar cell, a group II-VI compound semiconductor solar cell, or a group III-V compound semiconductor solar cell.

In addition, the solar cells 210 may be disposed on the lower substrate 220. In other words, the solar cells 210 may be disposed on a transparent substrate such as a glass substrate.

The solar cells 210 may be arranged in the shape of a stripe. In addition, the solar cells 210 may be arranged in various shapes including the shape of a matrix.

A bus bar 500 is disposed on the solar cell panel 200. The bus bar 500 makes contact with the top surfaces of two of the solar cells 210 while being electrically connected to the solar cells 210.

For instance, the bus bar 500 includes first and second bus bars.

The first bus bar makes contact with the top surface of the leftmost of the solar cells 210, and the second bus bar makes contact with the top surface of the rightmost of the solar cells 210.

The bus bar 500 is a conductor. The bus bar 500 may include copper (Cu).

The bus bar 500 extends from a top surface of the lower substrate 220 to the edge of the lower substrate 220.

The protective substrate 300 is disposed on the solar cell panel 200. In detail, the protective substrate 300 is disposed to face the solar cell panel 200. In detail, the protective substrate 300 is spaced apart from the solar cell panel 200 by a predetermined distance.

The protective substrate 300 may be transparent and have high strength. The material constituting the protective substrate 300 may include tempered glass.

The spacer part 400 is interposed between the solar cell panel 200 and the protective substrate 300.

The spacer part 400 includes an air layer 410 and a spacer 420.

The air layer 410 may be placed at the central portion of the spacer part 400. The air layer 410 may be filled with nitrogen ($N_2$) or argon gas (Ar).

The spacer 420 surrounds the air layer 410. The spacer 420 is placed at a rim part of the spacer part 400. In other words, the spacer 420 surrounds the rim part of the spacer part 400. Accordingly, the spacer 420 may be shaped in frame shape surrounding the air layer 410.

Accordingly, the spacer 420 is provided so that the protective substrate 300 may be spaced apart from the solar cell panel 200 by a predetermined interval. In addition, the spacer 420 allows the presence of the air layer 410.

The spacer 420 may include an absorbent. For instance, the spacer 420 may include glass fiber reinforced plastic (GRP). Accordingly, the spacer 420 can prevent the weight of the solar cell module from being increased while preventing moisture from being infiltrated into the solar cell module. In addition, the endurance and the impact-resistance of the solar cell module can be supplemented through the spacer 420.

The spacer 420 includes a contact spacer 421. The contact spacer 421 makes contact with the connection member 600. Therefore, the contact spacer 421 is placed at one edge of the solar cell panel 200 where the connection member 600 is placed.

Referring to FIG. 2, the contact spacer 421 includes a conductive part 430. In detail, the conductive part 430 may be placed at a portion of the contact spacer 421. In more detail, the conductive part 430 may surround the lateral side and the bottom surface of the contact spacer 421.

The conductive part 430 makes contact with the connection member 600. In other words, the conductive part 430 placed at the lateral side of the contact spacer 421 directly makes contact with the connection member 600.

Simultaneously, the conductive part 430 makes contact with the bus bar 500. In other words, the conductive part 430 placed on the bottom surface of the contact spacer 421 directly makes contact with the bus bar 500. In detail, the conductive part 430 directly makes contact with the bus bar 500 placed at the edge of the lower substrate 220.

Therefore, the conductive part 430 may extends from the edge of the contact spacer 421 to make contact with the bus bar 500.

Accordingly, the conductive part 430 electrically connects the bus bar 500 to the connection member 600.

The conductive part 430 includes conductive metal.

According to the solar cell module of the embodiment, the bus bar 500 and the connection member 600 can be connected to each other without forming a hole in the lower substrate 220. Therefore, the lower substrate can be prevented from being broken due to variable causes including high temperature during the process of the solar cell module. Accordingly, the process yield rate can be improved. In addition, a hole machining tool, which is employed to form a hole in the lower substrate according to the related art, is not employed, so that the process time and the process cost can be reduced.

The spacer part 400 includes the air layer 410 to block heat from being conducted, so that the thermal insulation of the solar cell module can be improved. Accordingly, the solar cell module can be used as the building glass for a window.

In addition, the EVA sheet to bond the protective substrate 300 with the solar cell panel 200 may be omitted from the solar cell module by using the spacer part 400. Accordingly, the reliability of the solar cell module can be prevented from being degraded due to the moisture absorbed in the EVA sheet. In addition, since the EVA sheet is omitted, the material cost can be saved. In addition, the lamination process to form the EVA sheet can be omitted, so that the module process can be simplified. In addition, the weight of the solar cell module is reduced, so that the solar cell module can be easily fabricated.

Thereafter, the bonding part 450 is placed at the rim part of the spacer 420. In other words, the bonding part 450 may be interposed between the protective substrate 300 and the solar cell panel 200. The bonding part 450 may bond the solar cell panel 200 with the protective substrate 300. In detail, the bonding part 450 allows the stable bonding of the solar cell panel 200, the protective substrate 300, and the spacer 420.

The bonding part 450 may include butyl. The bonding part 450 can prevent moisture from being infiltrated into the solar cell module.

The connection member 600 is placed at the edge of the solar cell panel 200. The connection member 600 may connect the bus bar 500 to a cable (not shown).

The connection member 600 may include a junction box.

The cable is electrically connected to the solar cell panel 200 through the connection member 600 and the bus bar 500. In other words, the cable is used to transfer the electrical energy generated from the solar cell panel 200 to a rectifier and/or a battery.

In addition, the cable may connect adjacent solar cell modules to each other. In other words, a plurality of solar cell modules may be connected to each other through the cable.

The cable may be connected to the connection member 600 through solder paste.

Meanwhile, although not shown, a frame may be, further placed at the outer portion of the solar cell panel 200. The frame may receive the solar cell panel 200, the protective substrate 300, and the spacer part 400. If necessary, the frame may receive the connection member 600.

The features, structures, and effects described in the above embodiments are included in at least one embodiment of the present invention, and are not necessarily limited to only one embodiment. Moreover, the features, structures, and effects described in the embodiments may also be combined or modified to be carried out in other embodiments by those skilled in the art to which the embodiments pertain. Thus, the contents related to the combination and modification shall be construed to be included in the scope of the present invention.

Further, although the embodiments have been mainly described until now, they are just exemplary and do not limit the present invention. Thus, those skilled in the art to which the present invention pertains will know that various modifications and applications which have not been exemplified may be carried out within a range which does not deviate from the essential characteristics of the embodiments. For example, the constituent elements described in detail in the exemplary embodiments can be modified to be carried out. Further, the differences related to such modifications and applications shall be construed to be included in the scope of the present invention specified in the attached claims.

The invention claimed is:

1. A solar cell module comprising:
a solar cell panel comprising a plurality of solar cells and at least one bus bar electrically connected to the solar cells;
a protective substrate on the solar cell panel;
a spacer part placed between the solar cell panel and the protective substrate to keep the solar cell panel and the protective substrate spaced apart from each other by a predetermined interval; and
a connection member which is placed close to a portion of an, edge of the solar cell panel from an outside of a rim part of the spacer part, and which is electrically connected to the solar cell panel so that the solar cell panel can be electrically connected through the connection member to a cable for transferring electrical energy generated from the solar cell panel or for connecting, solar cell modules to each other,
wherein the spacer part comprises an air layer and a spacer surrounding the air layer,
wherein the spacer comprises a contact spacer placed at a corresponding position to the portion of the edge of the solar cell panel where the connection member is placed,
wherein a conductive part is provided on a portion of the contact spacer so as to be brought into contact with the connection member,
wherein the conductive part is formed to directly contact a lateral side of and a bottom surface of the contact spacer,
wherein the conductive part simultaneously makes contact with the connection member and the bus bar, and
wherein the conductive part is electrically connected to both of the bus bar and the connection member.

2. The solar cell module of claim 1, wherein the spacer is placed at a rim part of the spacer part to be shaped in frame shape surrounding the air layer.

3. The solar cell module of claim 1, wherein the spacer includes a moisture resistant to prevent moisture from infiltrating into the solar cell module.

4. The solar cell module of claim 1, further comprising a bonding part at a rim of the spacer.

5. The solar cell module of claim 4, wherein the bonding part bonds the solar cell panel with the protective substrate.

6. The solar cell module of claim 4, wherein the bonding part includes butyl.

7. The solar cell module of claim 1, wherein the conductive part is formed at an edge of the contact spacer so as to make contact with the bus bar.

8. The solar cell module of claim 1, wherein the conductive part includes conductive metal.

9. The solar cell module of claim 1, wherein the air layer includes nitrogen ($N_2$) or argon gas (Ar).

10. The solar cell module of claim 3, wherein the spacer includes glass fiber reinforced plastic (GRP).

* * * * *